United States Patent [19]

Tokura

[11] Patent Number: 5,206,705
[45] Date of Patent: Apr. 27, 1993

[54] METHOD OF CHECKING EXTERNAL SHAPE OF SOLDER PORTION

[75] Inventor: Nobufumi Tokura, Fukuoka, Japan

[73] Assignee: Matsushita Electric Industrial Co., Ltd., Osaka, Japan

[21] Appl. No.: 623,499

[22] Filed: Dec. 7, 1990

[30] Foreign Application Priority Data

Dec. 13, 1989 [JP] Japan .................. 1-323351

[51] Int. Cl.⁵ .................. G01B 11/24; G01N 21/00
[52] U.S. Cl. .................. 356/376; 356/377; 356/237
[58] Field of Search ............. 356/376, 377, 394, 398, 356/237; 250/572, 562, 563, 560; 358/101, 106, 107

[56] References Cited

U.S. PATENT DOCUMENTS

| | | | |
|---|---|---|---|
| 4,343,553 | 8/1982 | Nakagawa et al. | 356/376 |
| 4,650,333 | 3/1987 | Crabb et al. | 356/376 |
| 4,674,869 | 6/1987 | Pryor et al. | 356/377 |
| 4,911,550 | 3/1990 | Hisakuni | 356/376 |
| 4,988,202 | 1/1991 | Nagar et al. | 356/394 |
| 5,011,960 | 4/1991 | Ando et al. | 356/398 |
| 5,064,291 | 11/1991 | Reiser | 356/394 |

FOREIGN PATENT DOCUMENTS

| | | |
|---|---|---|
| 0209650 | 1/1987 | European Pat. Off. . |
| 0355377 | 2/1990 | European Pat. Off. . |
| 0205808 | 9/1986 | Japan .................. 356/376 |
| 63-177042 | 7/1988 | Japan . |
| 63-177045 | 7/1988 | Japan . |
| 0044233 | 2/1990 | Japan .................. 356/237 |
| 0044234 | 2/1990 | Japan .................. 356/237 |

OTHER PUBLICATIONS

Park, et al., "A Solder Joint Inspection System for Automated Printed Circuit Board Manufacturing," IEEE International Conference on Robotics and Automation, pp. 1290–1295, May 1990.

Primary Examiner—Richard A. Rosenberger
Assistant Examiner—Hoa Q. Pham
Attorney, Agent, or Firm—Stevens, Davis, Miller & Mosher

[57] ABSTRACT

The upper-limit height of a solder portion based on the thickness of a lead or a chip is set, and the maximum height of the solder portion measured with a laser beam is compared with the set upper-limit height, thereby to judge the acceptance or rejection of the shape of the solder portion. In addition, the lower-limit height of a solder portion based on the thickness of a lead or a chip is set, and the maximum height of the solder portion measured with a laser beam is compared with the set lower-limit height, thereby to judge the acceptance or rejection of the shape of the solder portion. Besides, the lower-limit wetting angle of a solder fillet is set, and the wetting angle of the solder fillet measured with a laser beam is compared with the set lower-limit wetting angle, thereby to judge the acceptance or rejection of the shape of the solder fillet.

1 Claim, 2 Drawing Sheets

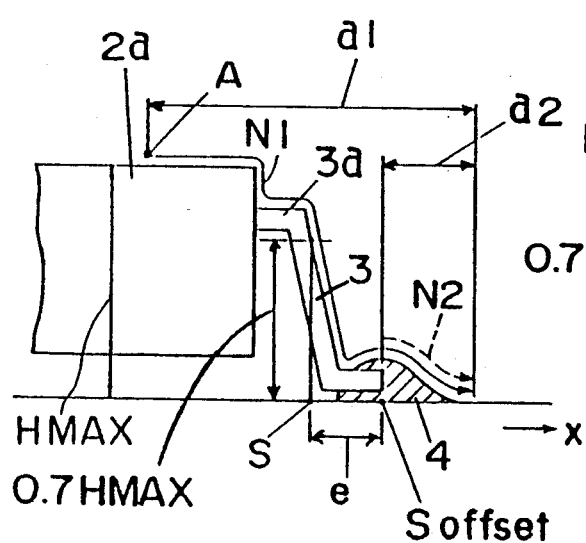
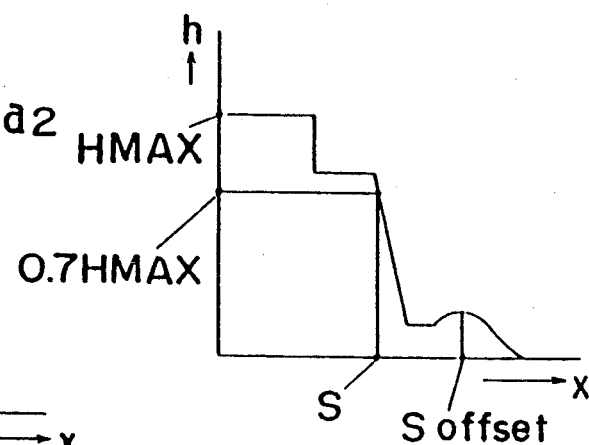
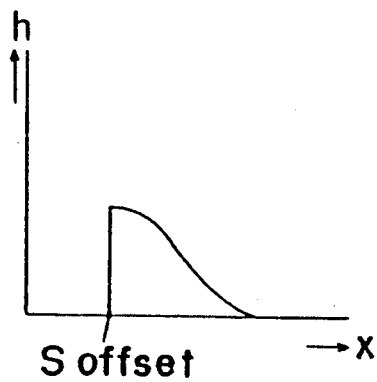
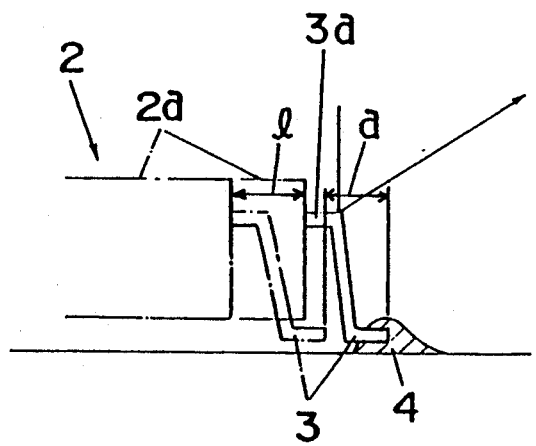

METHOD OF CHECKING EXTERNAL SHAPE OF SOLDER PORTION

BACKGROUND OF THE INVENTION

The present invention relates to a method of checking the external shape of a solder portion. More particularly, in a method of checking the external shape of a solder portion wherein the solder portion is sweepingly irradiated with a laser beam and wherein light reflected from the solder portion is detected by a position sensor, the invention consists in that a reasonable criterion for the acceptance or rejection of the solder shape is set so as to objectively check the external appearance of the solder portion.

It is known to judge the acceptance or rejection of a solder shape in such a way that a solder portion for bonding an electronic component to a circuit board is sweepingly irradiated with a laser beam, whereupon light reflected from the solder portion is detected by a position sensor (refer to, for example, the official gazettes of Japanese Patent Applications Laid-open No. 177042/1988 and No. 177045/1988).

Heretofore, however, it has been the actual circumstances that a criterion for the acceptance or rejection of the solder shape is not definite, so the acceptance or rejection is judged somewhat arbitrarily or subjectively. Accordingly, for the purpose of establishing a technique for the judgement of the acceptance or rejection of the solder shape based on the sweeping projection of the laser beam, it is required to set the reasonable criterion as a premise and to check the external appearance of the solder portion in accordance with the criterion.

SUMMARY OF THE INVENTION

An object of the present invention is to provide a method of checking the external shape of a solder portion in order to objectively judge the acceptance or rejection of the solder shape.

In order to accomplish this objective, according to the present invention, (i) the upper-limit height of the solder portion based on the thickness of a lead or a chip, (ii) the lower-limit height thereof, or (iii) the lower-limit wetting angle of a solder fillet being the solder portion is set as a criterion for the acceptance or rejection of the solder shape.

With the checking method as described above, the maximum height or the wetting angle of the solder portion is measured by sweepingly projecting a laser beam on the solder portion and then detecting light reflected from the solder portion, and the measured value is compared with the preset upper-limit height, lower limit height or lower-limit wetting angle, whereby the acceptance or rejection of the solder shape is judged.

BRIEF DESCRIPTION OF THE DRAWINGS

FIG. 3 is a side view for explaining the proceeding of a measurement;

FIGS. 4 and 5 are graphs each showing a measured result; and

FIG. 6 is a side view showing the chip of a minitransistor.

PREFERRED EMBODIMENTS OF THE INVENTION

Now, the embodiments of the present invention will be described with reference to the drawings.

Figure 1:
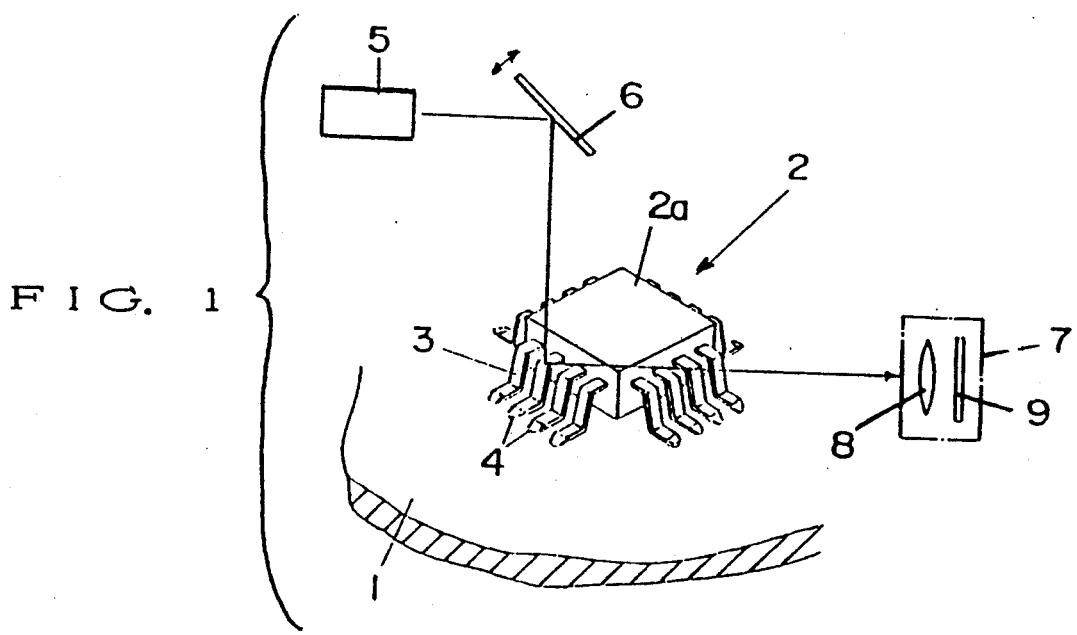
FIG. 1 is a perspective view showing a solder shape checking apparatus for use in the embodiments of the present invention.

FIG. 1 is a perspective view of an apparatus for checking the external shape of a solder portion. Numeral 1 designates a circuit board, on the upper surface of which an electronic component (hereinbelow, termed "chip") 2 is mounted. Numeral 3 indicates a lead extended out of the mold member 2a of the chip 2, and numeral 4 a solder portion for bonding the lead 3 to the circuit board 1. Shown at numeral 5 is a laser device from which a laser beam is projected. The light spot of the laser beam is reflected by a mirror 6 so as to irradiate the solder portion 4, and the reflected light thereof from the solder portion 4 enters a light receiving unit 7. On that occasion, the laser beam is swept and projected along each solder portion 4 by rotating the mirror 6. The light receiving unit 7 includes a focusing element such as convex lens 8, and a position sensor such as PSD (positioning sensitive device) 9.

Figure 2A:
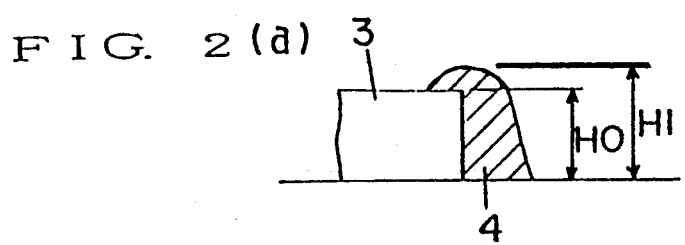
FIGS. 2(a), 2(b) and 2(c) are sectional views each showing a solder portion.
Figure 2B:
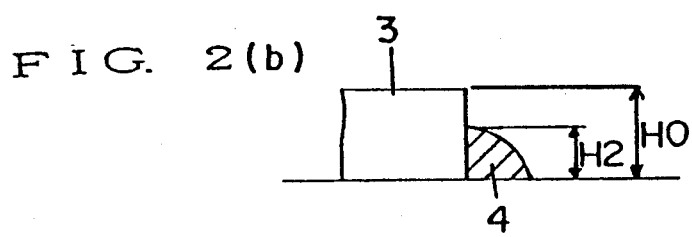
Figure 2C:
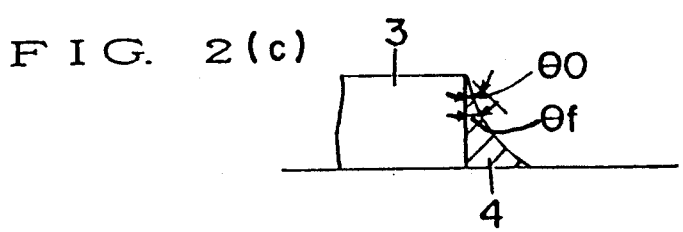

Each of FIGS. 2(a)–2(c) shows an expedient for judging the acceptance or rejection of the external shape of the solder portion 4. In FIG. 2(a), symbol H0 denotes the thickness of the lead 3. Alternatively, regarding an electronic component, such as ordinary chip capacitor or chip resistor, in which the solder portion 4 is formed on the side wall of the chip, the symbol H0 shall denote the thickness of the chip. The lead thickness or chip thickness H0 differs depending upon the kinds of the articles of the chips. It is accordingly reasonable to stipulate the allowable upper-limit height of the solder portion 4 as the function $\alpha H0$ of the thickness H0 (where $\alpha$ is a parameter). The maximum height H1 of the solder portion 4 which is measured is compared with the upper-limit height $\alpha H0$ serving as a criterion for the acceptance or rejection, thereby forming the basis for judging whether the solder shape is accepted or rejected. That is, when $H1 > \alpha H0$ holds, the solder shape is judged N.G. or defective. The parameter $\alpha$ is set in accordance with the kind of the article of the chip and is 1.3 by way of example.

Referring to FIG. 2(b), for the same reason as in the above example, it is reasonable to set the lower-limit height $\beta H0$ ($\beta$ being a parameter) of the solder portion 4 in accordance with the kind of the article of the chip as the second criterion for the acceptance or rejection of the solder shape. The maximum height H2 of the solder portion 4 which is measured is compared with the lower-limit height $\beta H0$, thereby forming the basis for judging whether the solder shape is accepted or rejected. That is, when $H2 < \beta H0$ holds, the solder shape is judged N.G. or defective. The parameter $\beta$ is, for example, 0.6.

Referring to FIG. 2(c), it is reasonable to set the lower-limit wetting angle or inclination angle $\theta 0$ of a solder fillet which constitutes the solder portion 4, as the third criterion for the acceptance or rejection of the solder shape. Thus, when the wetting angle $\theta f$ of the solder fillet 4 which is measured is less than the preset lower-limit wetting angle $\theta 0$, the solder shape is judged N.G.

As described above, when the criterion value $\alpha H0$, $\beta H0$ or $\theta 0$ concerning the acceptance or rejection of the solder shape is set beforehand, whether the solder shape is accepted or rejected can be judged objectively and appropriately by comparing the measured result with the criterion $\alpha H0$, $\beta H0$ or $\theta 0$. Incidentally, the parameter $\alpha$ or $\beta$ or the lower-limit wetting angle $\theta 0$ varies depending upon the accuracy of the shape required.

Meanwhile, with respect to some chips, for example, a minitransistor depicted in FIG. 6, the lead 3 is bent at an abrupt slope along the side wall of the mold member 2a of the chip 2. Regarding such a chip 2, first consider a case where the external shape of the solder portion 4 is measured by sweeping and projecting the laser beam along a predetermined measurement area a. In this case, when the chip 2 involves a positional deviation of length l in the direction of the sweeping projection, the laser beam is reflected by the shoulder 3a of the lead 3, and the height of the shoulder 3a is misrecognized as the maximum height H1 of the solder portion 4 explained above. Accordingly, $H1 > \alpha H0$ holds to judge the solder shape as being N.G. in spite of its being O.K. or non-defective. In the figure, dot-and-dash lines indicate the state of the chip 2 free from the positional deviation. Such misjudgments are prone to arise, not only as to a minitransistor, but also in a chip having leads of abrupt slope, such as a tantalum capacitor or coil, and a chip having long leads extending out sidewards, such as a QFP (quad flat package) or SOP (small out-line package). Therefore, a method of measuring the solder portion in such cases will now be described.

In FIG. 3, it is assumed that the chip 2 involves a considerable positional deviation. Here is set a measurement area a1 which is large enough to cover an extent from the mold member 2a to the outer end of the solder portion 4. The first sweeping projection of the laser beam is carried out from a start point A on the mold member 2a toward the solder portion 4, thereby to measure the external appearance of the chip 2 in the area a1. Symbol N1 denotes a sweep line on this occasion.

FIG. 4 shows the result of the first measurement. In the figure, symbol HMAX denotes the height of the upper surface of the measured mold member 2a. A spot S whose height (for example, 0.7 HMAX) is at a predetermined ratio (0.7) to the obtained height HMAX, is found. Subsequently, an offset spot $S_{offset}$ is set at a position which is a predetermined offset distance e away from the spot S toward the outer end of the solder portion 4. Next, a measurement area a2 for the second measurement is set so as to extend from the offset spot $S_{offset}$ to the side of the outer end of the solder portion 4. As the second measurement, the laser beam is swept and projected from a start point corresponding to the offset spot $S_{offset}$, as indicated by an arrow of broken line N2 in FIG. 3, thereby to measure the external shape of part of the solder portion 4 in detail. FIG. 5 shows the result of the second measurement.

Thus, according to this method, the solder fillet (the part extended at a downward slope from the distal end of the lead), which is very important for judging the acceptance or rejection of the solder shape, can be reliably measured. The aforementioned numerical values of 0.7, e, etc. are set beforehand in accordance with the kind of the article of the chip and the required accuracy of the shape.

The check of the external shape of the solder portion should desirably be performed at high speed over the largest possible extent. In this regard, the method illustrated in FIGS. 3 thru 5 has the disadvantage of expending a long time because the operation of sweepingly projecting the laser beam must be carried out twice. Therefore, the first sweeping projection which is done over the larger extent in order to determine the start point of the measurement area a2 for the second measurement is executed coarsely (at, for example, 2 mm/100 points), and the second sweeping projection which is done in order to measure the shape of the solder fillet in detail is executed finely (at, for example, 0.5 mm/100 points), whereby the checking speed can be raised.

As described above, according to the present invention, a reasonable criterion for the acceptance or rejection of a solder shape is stipulated, and whether the solder shape is accepted or rejected is judged by comparing a measured result with the set criterion, so that an appropriate and objective judgement as the acceptance or rejection can be made.

What is claimed is:

1. A method of checking an external shape of a solder portion of a chip which includes a mold member, a lead and said solder portion, the solder portion bonding said chip to a circuit board, comprising the steps of:
   (a) establishing a starting point at an upper surface of the mold member of said chip;
   (b) sweepingly projecting a laser beam from said starting point to said solder portion;
   (c) employing a position sensor to detect light reflected from said chip and said solder portion in order to measure an external shape of said chip and to detect a location of a reference part of the chip having a height at a predetermined ratio to a height of an upper surface of said molder member;
   (d) establishing an offset position which is offset by a predetermined distance from said location of said reference part toward the solder portion; and
   (e) sweepingly projecting the laser beam from said offset position toward an outer end of said solder portion in order to measure an external shape of said solder portion.

* * * * *